(12) United States Patent
Locker et al.

(10) Patent No.: US 6,297,702 B1
(45) Date of Patent: Oct. 2, 2001

(54) PHASE LOCK LOOP SYSTEM AND METHOD

(75) Inventors: Kevin Wayne Locker; Joseph Murray, both of Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/479,974

(22) Filed: Jan. 10, 2000

(51) Int. Cl.[7] ....................................................... H03L 7/06
(52) U.S. Cl. .............................. 331/2; 327/144; 375/356
(58) Field of Search ................................... 331/2, 10, 11; 327/141, 144, 145, 147, 156; 714/1; 368/46; 375/354, 357, 376

(56) References Cited

U.S. PATENT DOCUMENTS

| | | | |
|---|---|---|---|
| 4,692,715 | * 9/1987 | Spence | 331/2 |
| 5,748,569 | * 5/1998 | Teodorescu et al. | 368/118 |
| 5,787,265 | * 7/1998 | Leshem | 714/1 |

* cited by examiner

Primary Examiner—Tuan T. Lam

(57) ABSTRACT

Symmetrical cross coupled PLL circuits provide pseudo-synchronization between two independent clock signals, especially for use in fault tolerant applications. Independent oscillators provide input signals to each of the PLL circuits. The PLL circuits include divide circuitry that provide output signals at some sub multiple of the input clock signals. The phase relationship between the output clock signals from the cross coupled PLL circuits is monitored by phase detector circuits. If the phase of one output clock signal is determined to be advanced relative to the other output clock signal, the phase of that output clock signal is retarded by temporarily increasing the divide ratio of the PLL circuit producing the phase advanced signal.

17 Claims, 7 Drawing Sheets

PHASE LOCK LOOP SYSTEM AND METHOD

BACKGROUND OF THE INVENTION

This invention relates generally to a system and method for maintaining two or more clocks in pseudo-synchronization, and more specifically to a system and method using cross coupled phase lock loop circuits to maintain clocks in pseudo-synchronization, the system and method being especially applicable to fault-tolerant applications. The invention further relates to a system and method for maintaining the pseudo-synchronized clocks synchronized to a system clock.

Phase lock loop (PLL) circuits are devices that allow one clock (the slave clock) to lock onto or follow another clock (the master clock) in frequency and in phase. PLL circuits are often used in fault-tolerant systems that require redundancy. Redundant channels are provided, for example, in aircraft navigation and control systems to ensure that these systems remain operative even if a fault occurs in one of the channels. Upon the occurrence of a fault in one channel, the system employs the other channel to remain operative. The use of the master/slave concept provides a clock signal having the same frequency and phase relationship for each of the channels so that communication between the channels can be maintained.

There are a number of problems associated with the conventional master/slave PLL concept. In order to achieve complete redundancy, as is often required in fault tolerant applications, it is desirable to have fully independent channels. With fully independent channels, each channel is provided with and runs on its own separate oscillator. In the conventional PLL structure, however, only a single oscillator is used and multiple clock signals are generated and synchronized to that single oscillator. Such a system results in lack of total redundancy because of serial operations based on the single oscillator. If the single oscillator fails, for example, the redundancy is inoperative. Additionally, in a conventional master/slave clock arrangement, the slave PLL must be able to either advance the phase or retard the phase in response to the performance of the master PLL. This can result in an instantaneous clock signal frequency greater than the nominal clock signal frequency. All devices utilizing the clock signal must therefore be over designed for this higher frequency and such over design can result in increased cost and complexity.

In the prior art, if two independent oscillators were employed to generate two independent clock signals to achieve total redundancy and PLLs were used to synchronize the two clock signals, such prior solutions resulted in instability of the system. For example, if the phase of the clock signal used by a first channel A was detected to be advanced by 90° relative to the phase of the clock signal used by a second channel B, the PLL for channel A might attempt to retard the phase of its clock signal by 90° to align with the clock signal of channel B. Simultaneously the channel B PLL might attempt to advance the phase of its clock signal by 90° to align with the clock signal of channel A. The result after both corrections are made would be a relative phase of −90°. The process then repeats itself in reverse. The loop thus becomes unstable.

Thus, a need exists for a system and method to achieve pseudo-synchronization between two or more totally independent clock signals that overcomes the deficiencies of prior solutions.

BRIEF SUMMARY OF THE INVENTION

In accordance with one embodiment of the invention, two PLL circuits, each associated with an independent channel, are cross coupled. Each channel also includes an independent oscillator, each providing a clock signal having a nominal frequency nf. Each PLL operates by dividing the input clock signal to generate an output clock signal having a nominal frequency f. Phase information is exchanged between the two PLLs at a frequency $(1/m)$ f. A phase detector measures the relative phase relationship between the two exchanged clock signals and then adjusts the phase of the PLL output if the phase difference exceeds a predetermined value. If the phase difference exceeds the predetermined value, the phase of the leading clock signal is retarded by temporarily increasing the divide ratio of the PLL providing the advanced phase clock signal.

BRIEF DESCRIPTION OF THE DRAWINGS

The various embodiments of the invention will be better understood after consideration of the following description taken together with the figures in which.

DETAILED DESCRIPTION OF PREFERRED EMBODIMENTS

Figure 1:
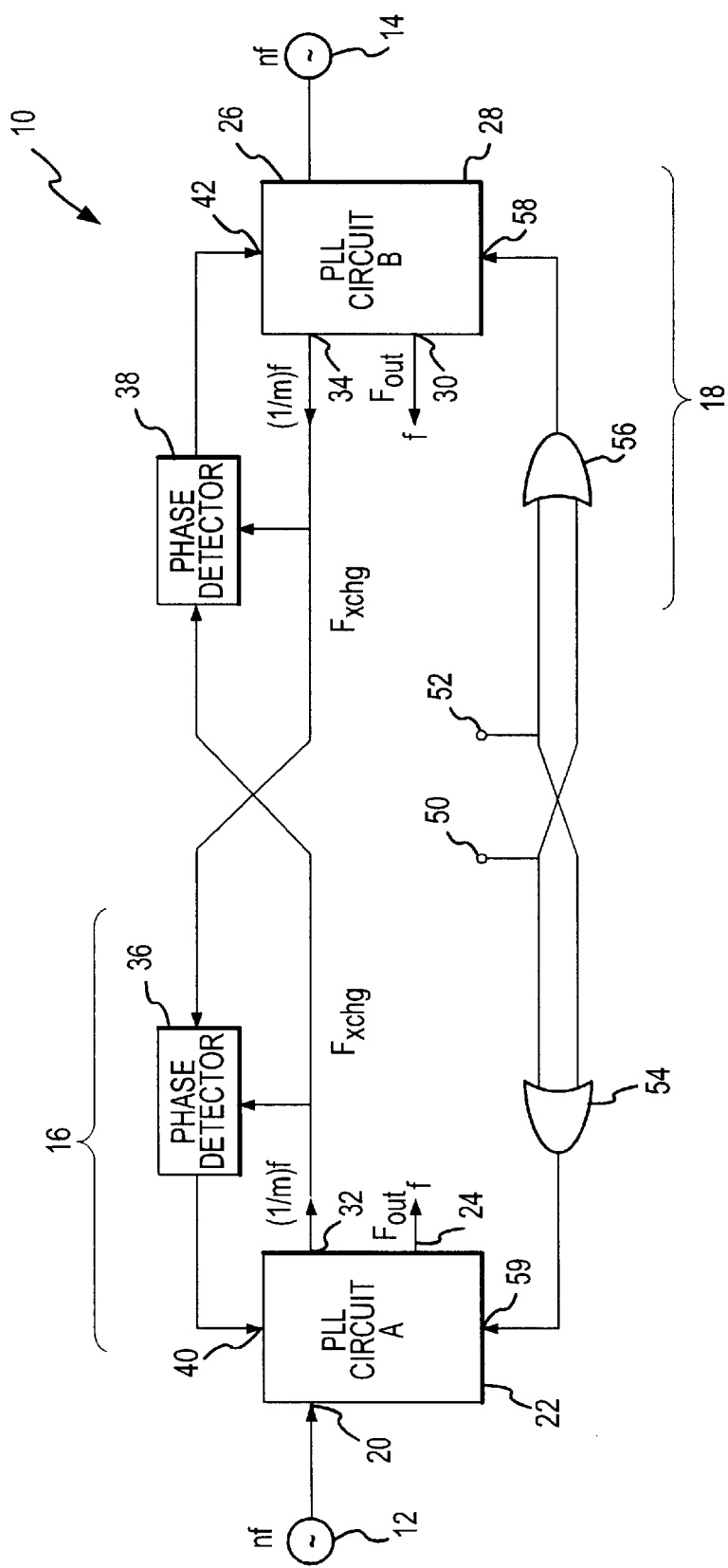
FIG. 1 illustrates, in block diagram form, one embodiment of the invention.

FIG. 1 illustrates, in block diagram form, a system 10 for maintaining two clock signals in pseudo-synchronization in accordance with one embodiment of the invention. In this context the term "pseudo-synchronization" is used to mean the two clock signals are synchronized in phase to the extent necessary to allow synchronous communication between the channels with which they are associated. The present invention is described in terms of functional blocks and various processing steps. It will be appreciated by those of skill in the art that such functional blocks may be realized by any number of hardware components configured to perform the specified functions.

System 10 includes two channels, an A channel 16 and a B channel 18. Where necessary to avoid confusion, signals will be identified by affixing, as appropriate, the letters "A" or "B" to the signal designation. In channel A, oscillator 12 provides a clock signal having a nominal frequency nf. This clock signal is applied as an input signal, $F_{in}$, to an input 20 of a PLL circuit 22. PLL circuit 22 includes a frequency divider having a divide ratio n that divides the input signal $F_{in}$ by n to produce an output signal $F_{out}$ having a nominal frequency f at an output 24 of the PLL.

In a similar manner, in channel B an oscillator 14 provides a clock signal having a nominal frequency nf that is applied as an input signal $F_{in}$ to an input 26 of a PLL circuit 28. PLL circuit 28 also includes a frequency divider having a divide ratio n and produces an output clock, $F_{out}$, having a nominal frequency f at output 30. In a preferred embodiment, both PLL circuit 22 and PLL circuit 28 are implemented as digital PLL circuits (DPLL).

Each of the PLL circuits also produce a sampling signal $F_{xchg}$ at a lower frequency, nominally $(1/m)$ f. PLL 22 provides $F_{xchg}$ A at an output 32, and PLL 28 produces $F_{xchg}$ B at an output 34. $F_{xchg}$ A provided at output 32 of PLL circuit 22 is applied as an input to phase detector 36 and also as an input to phase detector 38. $F_{xchg}$ B provided at output 34 of PLL circuit 28 is also applied as an input to both phase detector 36 and phase detector 38. Phase detectors 36 and 38 compare the phase relationship between the two inputs, $F_{xchg}$ A and $F_{xchg}$ B. If the phase of $F_{xchg}$ A is found to be advanced by more than a predetermined value compared to $F_{xchg}$ B, phase detector 36 provides a signal to PLL circuit 22 at input 40 to retard the phase of $F_{out}$ A by temporarily increasing the divide ratio in PLL circuit 22. If the phase of $F_{xchg}$ B is found to be advanced by more than a predetermined amount with respect to $F_{xchg}$ A, phase detector 38 provides a signal at input 42 of PLL circuit 28 and causes PLL circuit 28 to retard the phase of $F_{out}$ B by temporarily increasing the divide ratio in PLL circuit 28.

By retarding the phase of the leading signal in this manner, the two output signals, $F_{out}$ A and $F_{out}$ B are brought back into approximate synchronization. By retarding the more advanced clock signal, the design frequency is not exceeded and circuits designed to work at the clock frequency $F_{out}$ do not have to be over designed to work at a temporarily higher frequency.

FIG. 1 also illustrates, in accordance with an embodiment of the invention, the provision of reset signals by which the two PLL circuits can be initially synchronized. Reset signal A applied to pin 50 and reset signal B applied to pin 52 are logically OR'd at OR gates 54 and 56 which apply reset pulses to input 58 of PLL circuit 28 and to input 59 of PLL circuit 22, respectively. The application of the reset signals causes the two PLL circuits to start in synchronization.

In accordance with a preferred embodiment of the invention, the divide ratio for each of the PLL circuits is set equal to 4. For a divide ratio of 4, the relative phase between $F_{out}$ A and $F_{out}$ B can be adjusted in increments of plus or minus 90°. A greater divide ratio provides for finer adjustments in phase. Further, in accordance with a preferred embodiment, the phase sampling is done every other cycle. This is accomplished by setting m=2.

Figure 2:
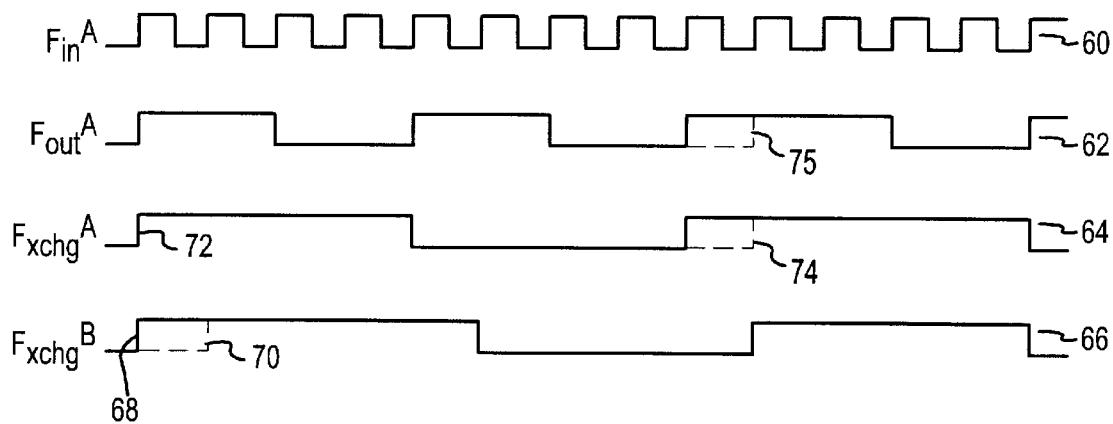
FIGS. 2, 5, and 7 illustrate clock signal wave forms generated in accordance with various embodiments of the invention.

FIG. 2 illustrates representative clock pulses consistent with the operation of the system illustrated in FIG. 1. In accordance with one embodiment of the invention, trace 60 illustrates an input clock signal such as that received at input 20 or 26 from oscillator 12 or 14, respectively. Trace 62 represents the output clock signal such as the clock signal $F_{out}$ A present at output 24. In accordance with one embodiment of the invention, the output signal corresponds to the input signal divided by n, in this illustrative example, 4. Trace 64 represents the sampling signal, $F_{xchg}$ A present at output 32 of PLL circuit 22. Trace 66 represents the sampling signal, $F_{xchg}$ B present at output 34 of PLL circuit 28. Each of signals 64 and 66 correspond to the output signal from the respective PLL circuits divided by the factor m, in this illustrative example, 2. The phase detectors 36 and 38 measure the relative phase between signals 64 and 66. Ideally, the rising edge 68 of trace 66 would occur at the same time, or within a predetermined time, of the rising edge 72 of trace 64. If instead, $F_{exch}$ B is delayed as indicated by the dashed lines, so that rising edge 68 of signal 66 is detected to differ from rising edge 72 of signal 64 as illustrated by the dashed line 70, phase detector 36 will cause a temporary increase in the divide ratio of PLL circuit 22 to retard the phase of signal 64 and of signal 62 to cause a shift in phase of signals 64 and 62 to those illustrated by the dashed lines 74 and 75, respectively. The phase delay is preferably timed to affect the next rising edge of signal 64 so that the signals are once more in phase at the end of the cycle. The phase relationship between signals 64 and 66 (and hence between $F_{out}$ A and $F_{out}$ B) is thus periodically examined, for example, during every other cycle of signals $F_{out}$ A and $F_{out}$ B. If the phase of one of these signals is detected to be advanced ahead of the other signals by more than a predetermined amount, a one time correction is made to the more advanced signal to bring the two signals back into synchronization. The one time correction to the phase essentially adds one more cycle, as represented by trace 60, to the more advanced signal. That is, if one signal is detected to have slowed down or been retarded in phase, the phase of the clock from the other PLL is temporarily retarded to bring the two signals into pseudo-synchronization.

Figure 3:
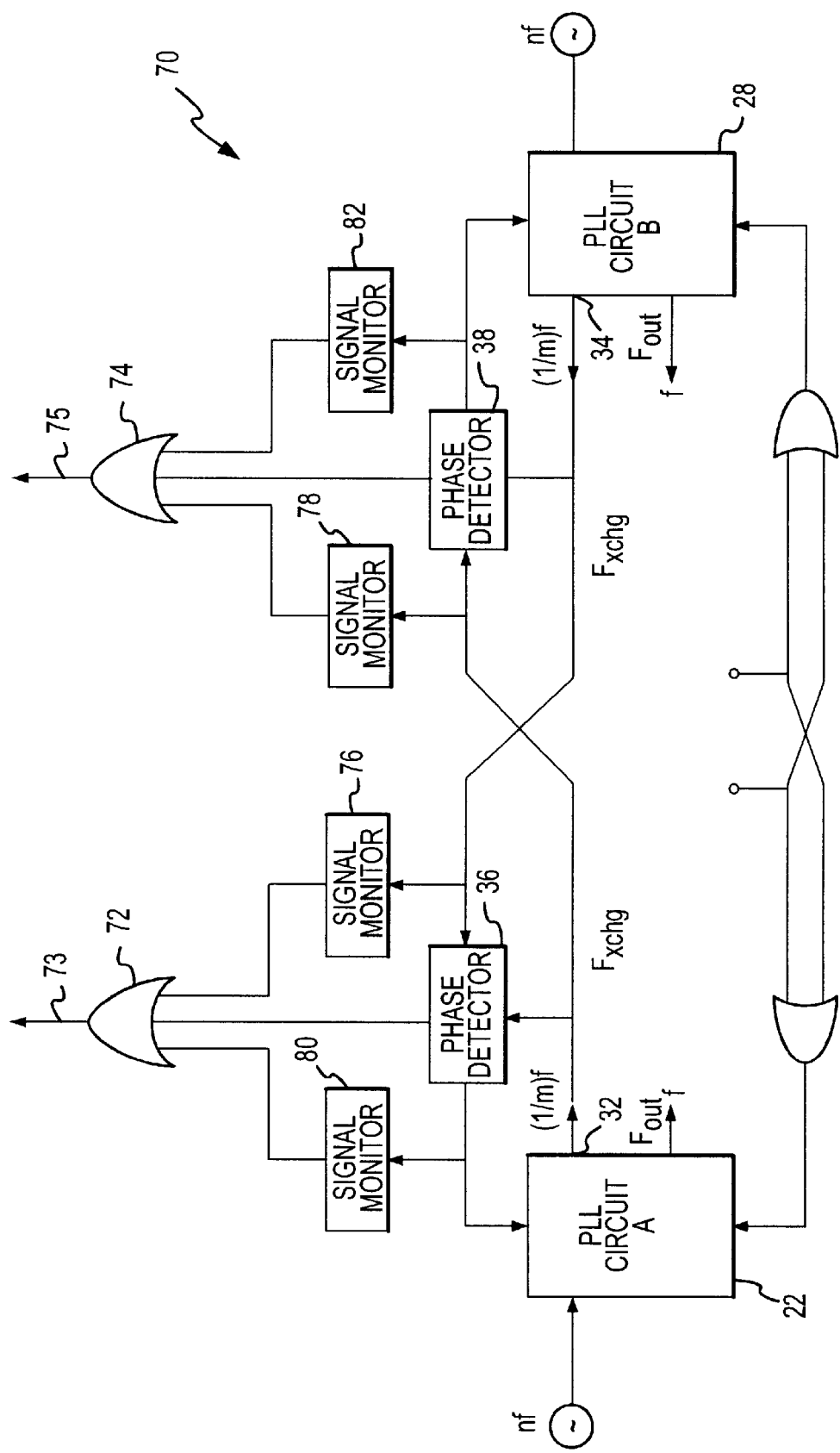
FIGS. 3, 4, and 8 illustrate, in block diagram form, further embodiments of the invention.

FIG. 3 illustrates a system 70 for maintaining two clock signals in pseudo-synchronization in accordance with a further embodiment of the invention. Like system 10 illustrated in FIG. 1, system 70 includes two channels A and B, two cross-coupled PLL circuits 22 and 28, and two associated phase detectors 36 and 38. System 70 finds application especially in fault tolerant applications. Clock monitors, to be more fully described below, are added to each of the channels of the system and the outputs from the clock monitors are OR'd at OR gate 72 and OR gate 74, respectively. Outputs 73 and 75 from the two OR gates are provided to a controlling computer (not shown) to indicate that an out-of-specification condition exists.

Monitors 76 and 78, which monitor the sample signals from each of the PLL circuits, detect a "stuck-at" condition or a very low frequency fault by counting the cycle time on the signals from outputs 32 and 34 of PLL circuits 22 and 28, respectively. A "stuck-at" condition means the monitored signal is stuck-at a "1" level or a "0" level and is not oscillating. The monitored signal, rather than oscillating, is a flat line. In accordance with one embodiment of the invention, if a flat line signal is detected from one of the PLLs, the other PLL does not follow this condition because an update to phase is only made in response to a signal transition. If there is no signal transition, i.e., no transition from "0" to "1" or from "1" to "0", no correction is made. Such a flat line condition, however, is reported to the controlling computer by the output of either OR gate 72 or OR gate 74.

Monitors 80 and 82 are coupled between the phase detector and the corresponding PLL circuit in each channel. These monitors detect relatively small frequency differences or errors in the monitored signals. These errors may not be large enough to cause the PLL circuits to lose lock, but may nevertheless exceed the specified tolerance of the system design. These monitors operate by counting the rate at which the phase detector is requesting phase corrections. That is, the monitors measure the difference in frequencies and can be programmed to trip at pre-determined frequency differences. Again, a signal from monitor 80 or 82, indicating that the system is out of specification, causes a signal to be sent from either OR gate 72 or OR gate 74 to the controlling computer indicating that such a condition exists.

Phase detectors 36 and 38 can also be programmed to detect large phase differences and to send a signal to OR gate 72 or OR gate 74 upon the detection of such a large phase difference. A large phase difference may result, for example, from a failure of the PLL circuits to achieve lock. System 70, in accordance with the preferred embodiment illustrated, is designed to maintain lock if the drift in phase is 1 part in 8 or less. If the drift in phase exceeds 1 part in 8, this condition causes the phase detector to report such a condition to the corresponding OR gate.

Figure 4:
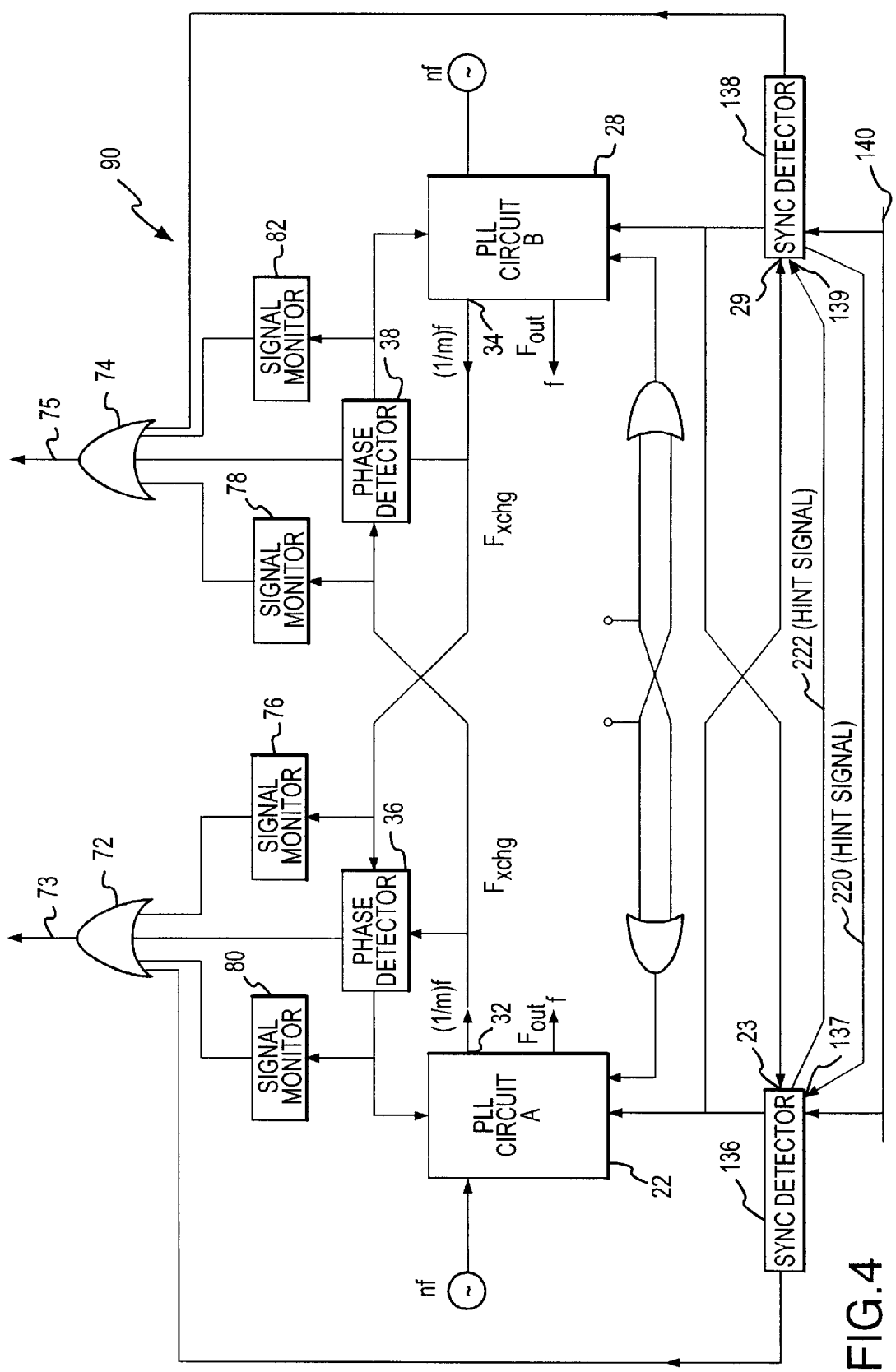

FIG. 4 illustrates, in block diagram form, a system 90 for maintaining pseudo-synchronization between clock signals in two redundant channels, and, further, for providing synchronization with a system clock signal. System 90 may be one of many modules that make up a total system. Not only must pseudo-synchronization be maintained within system 90, but system 90 must be kept in synchronization with other modules of the system. In accordance with one embodiment of the invention, the core of system 90 is similar to system 70 illustrated in FIG. 3. In addition, system 90 includes a synchronization ("sync") detector 136 coupled to an input 23 of PLL circuit 22 and a sync detector 138 coupled to an input 29 of PLL circuit 28. Sync detectors 136 and 138 are cross coupled with an output of sync circuit 136 coupled to an input of sync circuit 138 and an output of sync circuit 138 coupled to an input of sync circuit 136. Each of sync circuits 136 and 138 also receive an input from a system sync bus 140. System sync bus 140 may also carry data or other signals. An output of sync detector 136 is also coupled to OR gate 72 and an output of sync detector 138 is coupled to OR gate 74. In addition, an output of sync detector 136 is coupled to an input 139 to sync detector 138, and an output of sync detector 138 is coupled to an input 137 of sync detector 136.

Figure 5:
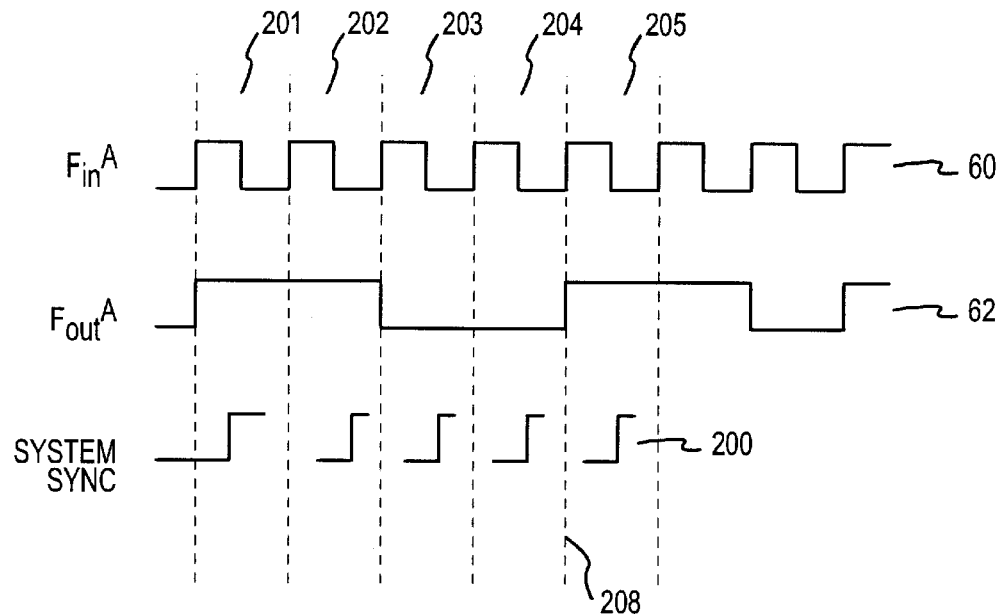

The need for and operation of the system synchronization provided by system 90 can be understood from a consideration of the timing diagrams illustrated in FIG. 5. $F_{in}$ A clock signal 60 and $F_{out}$ A clock signal 62 are again illustrated. Signal 200 illustrates several possible scenarios for the arrival of a system sync signal on sync bus 140. If signal 200 arrives during cycle 201, sync detector 136 will interpret clock signal 62 to be in synchronization with the system clock, and no change will be made to signal 62. Although the two signals may not be precisely synchronized, they are "close enough" to allow proper communication. If signal 200 arrives during cycle 202, however, sync detector 136 will cause PLL 22 to delay or retard its clock by one cycle to bring it into synchronization with the system clock. The delay can be effected by temporarily increasing the divide ratio of PLL 22. In similar manner, if signal 200 arrives during cycle 203 or 204, PLL 22 will delay its clock by two cycles or three cycles, respectively, to bring the clocks into pseudo-synchronization. If signal 200 arrives during cycle 205, sync detector 136 will interpret clock signal 62 to be in synchronization with the system clock, just as in cycle 201, and no change will be made to signal 62. At the same time that a comparison is being made between the channel A clock and the system clock, the same type of comparison and possible delay is being made between the channel B clock and the system clock. Although illustrated as synchronizing to a rising edge of signal 200, for reasons to be explained below, synchronization to such an edge may not be practical.

A potential problem can arise if the rising edge of signal 200 occurs near the boundary 208 between cycle 204 and 205. Because of the possible skew between the channel A clock and the channel B clock, channel A may interpret this to be a rising edge in cycle 204 and channel B may interpret this to be a rising edge in cycle 205. In that event, channel A would retard its clock by three cycles and channel B would leave its clock unchanged. As a result, the edges of the channel A clock and channel B clocks may be aligned, but one clock will be a full cycle behind the other clock. That is an unacceptable condition; to be in pseudo-synchronization, both channels must be on the same clock cycle. Such an unacceptable condition is avoided by a system in accordance with an embodiment of the invention.

In accordance with an embodiment of the invention, pseudo-synchronization is maintained between clocks of channels A and B and synchronization is maintained between each of those clocks and a common system clock. To maintain such system synchronization, an additional signal, to be described below, is passed, as needed, between channels A and B. In accordance with a preferred embodiment, the system is synchronized to a sync signal carried on synchronization bus 140. Synchronization bus 140 carries other signals, such as data, in addition to synchronization signals, and so synchronization signals are distinguished from data, noise, and other signals by their pulse width or in accordance with any other decoding scheme. Because the sync signal must first be decoded, synchronization to, for example, a rising edge of the sync signal may not be practical. Instead, synchronization is achieved at a predetermined time following the detection and decoding of the sync signal. Sync detectors 136 and 138 each include a counter that counts at the $F_{in}$ clock rate and that is triggered by the detection of a sync signal. Synchronization to the sync signal occurs at a later time after the counters reach a count of M, an arbitrary value. Although arbitrary, the same count M is used by the counters of both channel A and channel B and by all other modules that make up the total system. Since all channels of all modules are synchronized to the same system sync signal using the same count M, they will be synchronized to each other. Again with reference to FIG. 5, $F_{out}$ A, illustrated by trace 62, is synchronized to the system sync signal M counts after the detection of the system sync signal. If the counter reaches a count of M near boundary 208 between cycles 204 and 205, $F_{out}$ A is interpreted as being in synchronization and no change is made. If the counter reaches M−1 at boundary 208 indicating that $F_{out}$ A is advanced with respect to the system synchronization signal, the rising edge of trace 62 is pushed out one cycle. In a similar manner, if the counter reaches M−2 at boundary 208, the rising edge of trace 62 is pushed out two cycles, and if the counter reaches M−3 at boundary 208, the rising edge of trace 62 is pushed out three cycles. If the counter reaches M−4 at boundary 208, no change is made; it is too early to make a correction. Resynchronization thus occurs if the count is M−1, M−2, or M−3 at boundary 208. The counts for which resynchronization can occur is dependent on n, the divide ratio of the dividers in the PLL circuits, as will be explained below. The same procedure is used for synchronizing channel B.

Because of possible skew between the clocks of channel A and the clocks of channel B, however, the counts used for system synchronization may not be the same for the two channels. In accordance with one embodiment of the invention, for example, the counts recorded by the two channels may differ by as much as 2. The magnitude of the possible difference depends, in part, on the amount of skew permitted between the channels before pseudo-synchronization occurs. A difference in the count recorded by the two channels can result in the undesired result discussed above. To avoid that result, in accordance with an embodiment of the invention, and recognizing that resynchronization occurs if the count is M−1, M−2, or M−3, channel B backs up and takes action earlier in the count. If the count on the B channel is M−5, M−6, or M−7 at the time the $F_{out}$ B clock signal begins to rise, that indicates that the channel B is advanced and that a phase delay will be necessary in the next clock cycle. Channel B does not delay in response to this condition, but it does send a "hint" signal to channel A indicating the advanced condition and indicating that a resynchronization of the channel B clock is imminent. If channel A receives such a hint signal, channel A will also delay its clock at counts M−4 and M−5. Channel A will thus delay its clock at any count from M−1 to M−5 after receiving a hint signal and the problem is avoided. The explanation given above has been for an embodiment for which the divisor, n, in PLL 22 and PLL 28 is 4 and for which the possible skew between the clocks of the two channels is a maximum of 2 clock cycles. For example, the additional counts for which the channel A clock may be delayed (i.e., at counts M−4 and M−5) is in response to the possible skew in the two clocks resulting in a possible difference in count of 2. If the possible skew is less, so that only a difference in count of 1 is possible, only one additional count for resynchronization would be added, that is, M−4. If the skew could result in a possible difference in count of 3, resynchronization would be permitted for counts M−4 through M−6. In general, one of the channels (channel A, for example) will retard the phase of its clock if the output clock is to experience a rising edge at a count of M−n+x where x takes on values from x=1 to x=n−1 and n is the nominal divisor in PLL 22. The rising edge of the output clock, $F_{out}$ A is delayed by n−x cycles at the nominal frequency. The B channel will send a hint signal if the B channel output clock, $F_{out}$ B, experiences a rising edge at a count of M−2n+x. In response to the hint signal, the range of counts for which the divisor in PLL 22 is to be increased is extended to include a count of M−n+z where z takes on values from z=0 to z=1−y, where y is the maximum number of cycles by which the first clock can be skewed with respect to the second clock. The clock edge will be delayed by n−z cycles.

In accordance with an embodiment of the invention, the system is fully symmetric, so the foregoing description applies equally with the roles of the A and B channels reversed. This method will cause the clocks associated with each of the channels to be synchronized to a point in time M cycles (of the $F_{in}$ clock) after the detection of the system synchronization signal.

Referring again to FIG. 4, the necessary hint signals are exchanged on lines 220 and 222 between sync detectors 136 and 138. The hint signals are thus received at input 137 of sync detector 136 and at input 139 of sync detector 138. The hint signals are another condition that controls the divide ratio in PLLs 22 and 28, as necessary. A signal indicating the need for a delay is sent by sync detector 136 to input 23 of PLL circuit 22 or by sync detector 138 to input 29 of PLL circuit 28. An output of sync detector 136 and an output of sync detector 138 are also coupled to OR gates 72 and 74, respectively. In the event that one sync detector detects a valid system sync signal and the other sync detector does not, OR gate 72 or 74 conveys that information to the controlling computer.

Figure 6:
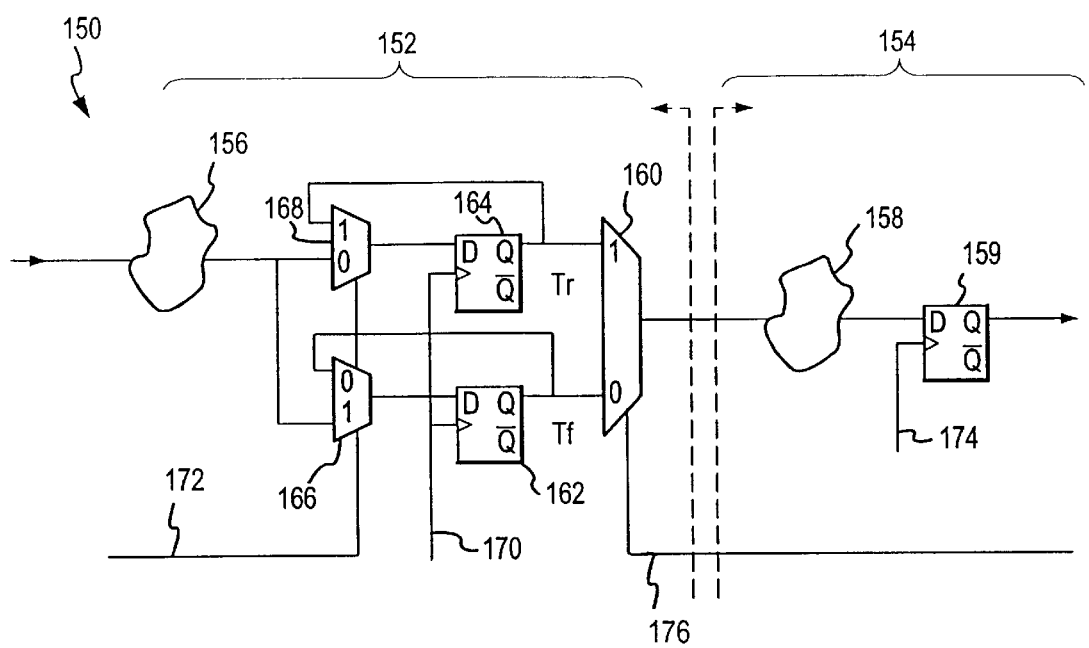
FIG. 6 illustrates a de-skewing circuit in accordance with a further embodiment of the invention.
Figure 7:
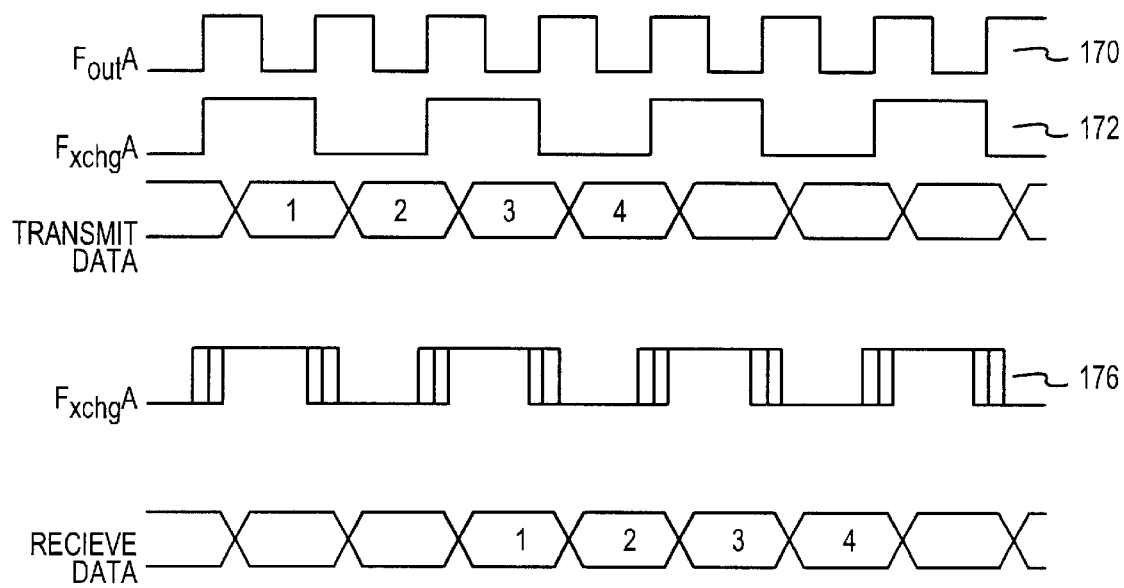

FIG. 6 illustrates schematically, in block diagram form, a de-skewing circuit 150 for the transmission of data from a first A channel 152 to a second B channel 154. FIG. 7 illustrates a timing diagram for the operation of circuit 150 in accordance with one embodiment of the invention.

Channels 152 and 154 are pseudo-synchronized in accordance with the system and method of the invention as previously described. Communication between the two channels is essentially pseudo-synchronous; i.e., the communication is synchronous in that there is a one-to-one clock relationship between the output clock signal $F_{out}$ from a PLL circuit associated with each of the channels. Utilizing the pseudo-synchronization in accordance with the invention, however, may provide for a considerable amount of skew between the two clock signals. For example, if the divide ratio in the two PLL circuits is 4, the skew may easily exceed plus or minus 90°. Because of the skew, the clock signals do not exactly overlap, and there is a considerable hold time during which communication is not possible because the two channels are not guaranteed to be on the same clock cycle. For reliable communication, the data produced by one channel must be valid at the time the receiving channel is clocked to receive the data. Although communication can be carried out on opposite edges of the clock signals to eliminate this problem, such a solution wastes another 180°, leaving only 90° for actual communication. When input and output delays are considered, this 90° may not provide sufficient time to reliably execute the communication. The de-skewing circuit 150 overcomes this problem.

The de-skewing circuit, in accordance with an embodiment of the invention, provides for transmission of data between a function 156 in channel 152 and a function 158 in channel 154. Data transferred to function 158 can be stored in a register, flip flop, or other suitable storage element 159. The de-skewing circuit includes a multiplexer 160, interleaved flip flops, registers, or other suitable storage elements (hereinafter referred to as "registers") 162 and 164, and multiplexers 166 and 168. Circuit 150 utilizes output clock signal $F_{out}$ A, here indicated by the numeral 170 and the sample clock $F_{xchg}$ A indicated by the numeral 172. Clock signals 170 and 172 are the clock signals associated with the PLL circuit for channel 152 as described earlier. For example, the PLL circuit for channel 152 corresponds to PLL circuit 22 in FIG. 3. Also utilized in synchronizing the transmission of data, are output clock signal $F_{out}$ B 174 and the sample clock signal $F_{xchg}$ B 176 associated with the PLL circuit for channel 154. The PLL circuit for channel 154 corresponds to a PLL such as PLL circuit 28 in FIG. 3. These clock signals are illustrated in FIG. 7, in which the clock signals are identified by the same identifying numeral. Note that exchange clock signals 172 and 176 may not be perfectly synchronized as indicated by the multiple possible leading edges and trailing edges indicated for signal 176.

The de-skewing circuit operates to place the data to be transferred into one of the two registers 162, 164 and allows the receiving channel to select from which of those registers data will be received. That is, channel 154 controls the operation of multiplexer 160 at the outputs of registers 162 and 164. While data is being transferred to one of the registers 162, 164, data can be read out of the other register. Recall that the signals $F_{xchg}$ A and $F_{xchg}$ B are pseudo-synchronized, but may be skewed with respect to each other. If $F_{xchg}$ A is low, data from function 156 will be loaded into register 164 and register 162 will not change. During the corresponding time that $F_{xchg}$ B is low, multiplexer 160 will select the data from register 162 to be transferred to function 158 and stored in register 159. Thus valid, stable data is read from register 162 while other data is being loaded into register 164. Correspondingly, when $F_{xchg}$ A is high, data from function 156 is read into register 162 and data in register 164 is unchanged. During the corresponding period when $F_{xchg}$ B is high, multiplexer 160 selects the output of register 164 and stable data is transferred from register 164 to function 158. Preferably de-skewing circuit 150 is duplicated for transmission of data from channel 154 to channel 152 so that transmission of data is symmetric in both directions between channels 152 and 154.

Figure 8:
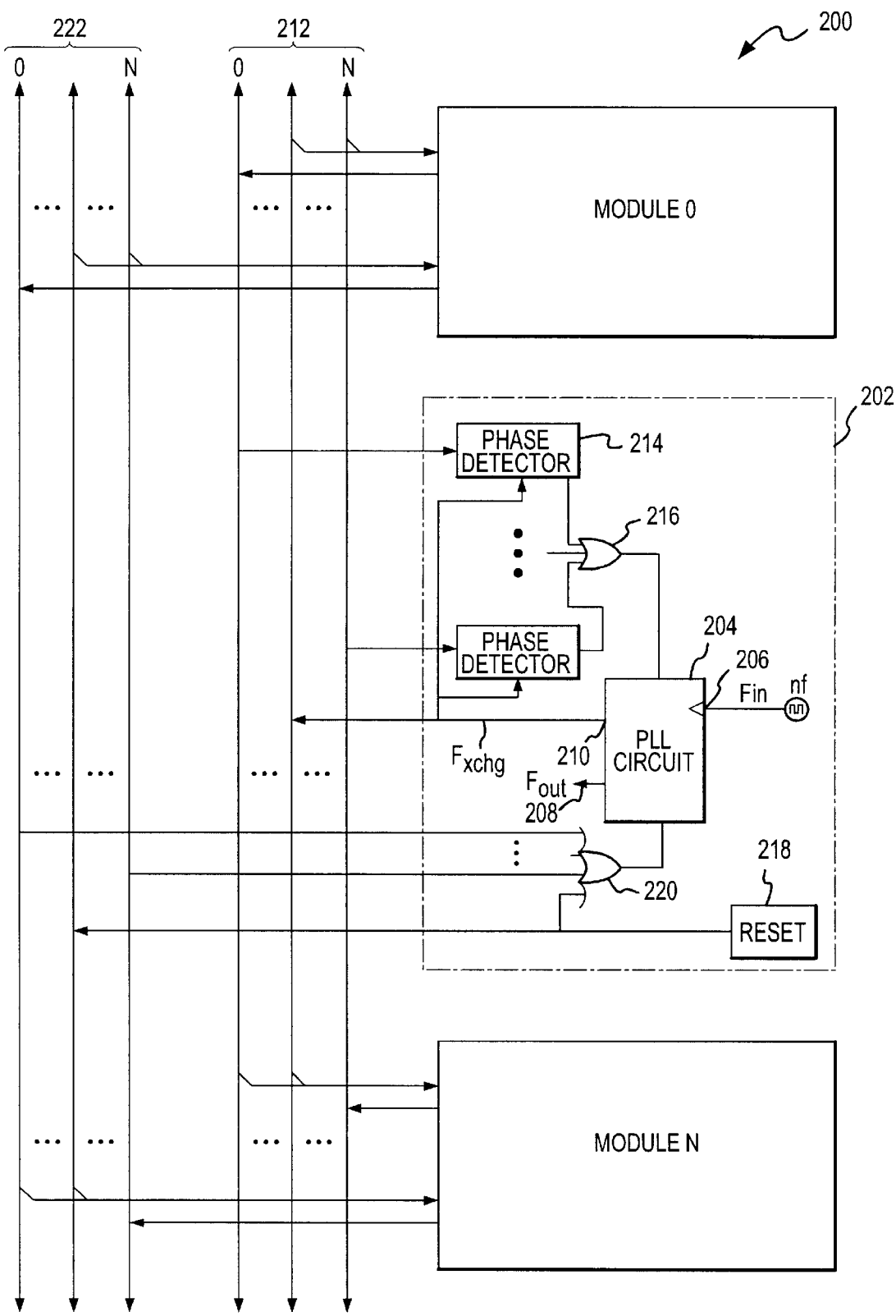

Although a system for maintaining two clock signals in pseudo-synchronization has previously been described in accordance with various embodiments of the invention, the system and method are not limited to maintaining only two clock signals in pseudo-synchronization. As illustrated in FIG. 8, the various embodiments of the invention can be extended to N clock signals. FIG. 8 illustrates, in block diagram form, one system 200 for maintaining N+1 clock signals in pseudo-synchronization.

In accordance with this embodiment, system 200 includes N+1 modules "0" through "N", each of which may be as illustrated for module 202. Each of the N+1 modules includes a PLL circuit 204 that receives an input clock signal $F_{in}$ of frequency nf at an input 206. The PLL circuits include divide circuitry with a divide ratio of n to output a clock signal $F_{out}$ of frequency f at output 208. Each PLL circuit also produces a sample clock signal $F_{xchg}$ of frequency (1/m)f at output 210. The sample clock signal $F_{xchg}$ from output 210 is coupled to a clock bus 212. Each of the modules also includes N phase detectors 214. Each of the N phase detectors in module 202 receives $F_{xchg}$ from its associated PLL circuit 204 and also receives $F_{xchg}$ from one of the other N modules in system 200 through clock bus 212. That is, each of the phase detectors is coupled to clock bus 212. Each of the N phase detectors compares the phase of the $F_{xchg}$ clock signal received from its associated PLL circuit 204 to the phase of the $F_{xchg}$ clock signal received from one of the other N modules. Each module thus compares the phase of its own $F_{xchg}$ with that of each other module and outputs a signal to OR gate 216 in response to the results of the comparison. If a phase detector determines that the phase of the $F_{xchg}$ clock signal from PLL circuit 204 is advanced by more than a predetermined amount relative to the phase of the $F_{xchg}$ clock signal from another module with which it is being compared, a correction signal from OR gate 216 causes a temporary increase in the divide ratio of PLL circuit 204 to cause a retardation of the phase of the signals outputted from PLL circuit 204. The $F_{out}$ clock signal appearing at output 208 is thus retarded to bring it into pseudo-synchronization with the output clock signals produced by each of the other modules.

In accordance with a preferred embodiment, each module 202 also includes a reset source 218. The reset source is coupled to the input of reset OR gate 220 and also to reset bus 222. Through reset bus 222, the signal from reset source 218 is coupled to a reset OR gate 220 included in each module 202. Each reset OR gate thus receives an input from the reset source on each module 202. The reset sources provide for the synchronous start up of system 200.

Thus it is apparent that there has been provided, in accordance with the invention, a system and method for maintaining two or more clock signals in pseudo-synchronization. Although the invention has been described and illustrated with reference to specific illustrative embodiments thereof, it is not intended that the invention be limited to these illustrative embodiments. Those of skill in the art will recognize that variations and modifications are possible without departing from the broad scope of the invention. For example, different divide ratios can be selected to provide different phase increments. Similarly, different sample increments can be selected by changing the divide ratio m. Also, different logic functions than those illustrated can be utilized to implement the various circuits. Although in a preferred embodiment the invention is implemented with digital phase lock loop circuits (DPLL), it is not intended that the invention be so limited. Accordingly, it is intended to include within the invention all such variations and modifications as fall within the scope of the appended claims.

In the claims:

1. A system for maintaining two clocks in pseudo-synchronization comprising:
    first and second oscillators, each providing a periodic signal of nominal frequency and phase;
    first and second cross coupled PLL circuits, the first PLL circuit having an input to receive the periodic signal from the first oscillator, and the second PLL circuit having an input to receive the periodic signal from the second oscillator, each of the first and second PLL circuits including a divider circuit for dividing the nominal frequency of the periodic signal received thereby by a divide ratio to generate a first output signal at an output of the first PLL circuit and a second output signal at an output of the second PLL circuit; and
    first and second phase detectors capable of measuring the relative phase relationship of the first and second output signals and temporarily increasing the divide ratio of the divider circuit of one of the first and second PLL circuits in response to detecting that the phase of the output signal from such PLL circuit is advanced relative to the phase of the output signal from the other of the first and second PLL circuits.

2. The system of claim 1 further comprising a reset circuit to initiate synchronous operation of the first and second PLL circuits.

3. The system of claim 1 further comprising clock monitors coupled to the first and second PLL circuits to provide an indication if one of the first and second output signals departs from a predetermined specification.

4. The system of claim 3 wherein the clock monitors comprise monitors for determining the failure of one of the first and second output signals to oscillate.

5. The system of claim 3 wherein the clock monitors comprise monitors for determining the variance in frequency of one of the first and second output signals from a predetermined frequency.

6. The system of claim 3 further comprising a logic gate coupled to the clock monitors.

7. A method for maintaining two clock signals in pseudo-synchronization comprising the steps of:
    providing first and second clock signals having a nominal frequency and phase;
    applying the first and second clock signals to inputs of first and second PLL circuits;
    dividing the frequency of each of the first and second clock signals by a divisor n to produce an output clock signal having a frequency equal to the nominal frequency divided by n at an output of each of the first and second PLL circuits;
    comparing the phase of the output clock signal from the first PLL circuit to the phase of the output clock signal from the second PLL circuit;
    temporarily increasing the divisor n in the first PLL circuit if the phase of the output signal from the first PLL circuit is advanced by more than a predetermined amount compared to the phase of the output signal from the second PLL circuit; and
    temporarily increasing the divisor n in the second PLL circuit if the phase of the output signal from the second PLL circuit is advanced by more than a predetermined amount compared to the phase of the output signal from the first PLL circuit.

8. The method of claim 7 wherein the step of comparing comprises:
    generating first and second sample clock signals at a sub harmonic of each of a respective one of the output clock signals;
    coupling first and second phase detectors to each of the first and second PLL circuits;
    providing the sample clock signals as inputs to the first and second phase detectors; and
    comparing the phase relationship of the first and second sample clock signals.

9. The method of claim 8 further comprising the step of coupling an output of the first phase detector to the first PLL circuit and coupling an output of the second phase detector to the second PLL circuit.

10. The method of claim 7 further comprising the step of synchronizing the first and second clock signals to a system clock.

11. The method of claim 10 wherein the step of synchronizing comprises the steps of:

detecting a system synchronization signal;

initiating a first count at the nominal frequency after detection of the system synchronization signal;

initiating a second count at the nominal frequency after detection of the system synchronization signal;

predetermining a count M at which each of the output clock signals from the first and second PLLs are to be pseudo-synchronized to the system synchronization signal;

temporarily increasing the divisor in the first PLL if the first output clock is to experience a rising edge at a count M−n+x; where x=1 through n−1 to delay the rising edge by n−x cycles at the nominal frequency; and extending the range of count for which the divisor in the first PLL is to be increased to include a count of M−n+z where z=0 to 1−y to delay the rising edge by n−z cycles where y is equal to the maximum number of cycles by which the first clock signal can be skewed with respect to the second clock signal in response to the second output clock experiencing a rising edge at a count of M−2n+x.

12. A method for maintaining two clock signals in pseudo-synchronization comprising the steps of:

providing a first PLL circuit coupled to a first clock oscillator and producing a first output clock signal;

providing a second PLL circuit coupled to a second clock oscillator and producing a second output clock signal;

measuring the relative phase relationship between the first and second output clock signals; and retarding the phase of the more advanced of the first or second output clock signals if the relative relationship exceeds a predetermined value.

13. A method of maintaining two clock signals in pseudo-synchronization with each other and with a system synchronization signal comprising the steps of:

providing a first PLL circuit coupled to a first clock oscillator and producing a first output clock signal;

providing a second PLL circuit coupled to a second clock oscillator and producing a second output clock signal;

measuring the relative phase relationship between the first and second output clock signals;

retarding the phase of the more advanced of the first or second output clock signals if the relative relationship exceeds a predetermined value;

synchronizing the first output clock signal to a system synchronization signal if the first output clock signal is advanced with respect to the system synchronization signal by retarding the phase of the first output clock signal at a predetermined time after detecting the system synchronization signal; and decreasing the predetermined time in response to a signal related to the second output clock signal indicating the second output clock signal is advanced from the system synchronization signal by an amount less than the amount the first output clock signal is advanced with respect to the system synchronization signal.

14. A system for maintaining a plurality of clock signals in pseudo-synchronization comprising:

a plurality of oscillators each providing a clock signal having a nominal frequency nf;

a plurality of PLL circuits, each of the PLL circuits having an input coupled to one of the plurality of oscillators for receiving a clock signal, each of the PLL circuits providing an output clock signal having a nominal frequency f at a first output and a sample clock signal having a nominal frequency $(1/m)f$ at a second output; and a phase detector capable of measuring the relative phase relationship between the plurality of sample clock signals and of retarding the phase of one of the plurality of output clock signals provided by one of the plurality of PLL circuits in response to a sample clock signal provided by such one of the plurality of PLL circuits having a phase advanced with respect to any other sample clock signal by more than a predetermined value.

15. The system of claim 14 wherein the phase detector comprises a plurality of phase detectors, each coupled to one of the plurality of PLL circuits and each having a first input for receiving a sample clock signal from the one of the plurality of PLL circuits and a second input for receiving a sample clock signal from another of the plurality of PLL circuits.

16. The system of claim 15 wherein each of the plurality of phase detectors comprises an output coupled to the one of the plurality of PLL circuits for providing to the one of the plurality of PLL circuits a signal responsive to the measurement of relative phase relationship.

17. The system of claim 16 wherein the outputs of the plurality of phase detectors are coupled to a logic gate and the logic gate is coupled to the one of the plurality of PLL circuits.

* * * * *